United States Patent
Galbraith et al.

(10) Patent No.: US 10,404,290 B2
(45) Date of Patent: Sep. 3, 2019

(54) NON-BINARY DECODING USING TENSOR PRODUCT TRANSFORMS

(71) Applicant: Western Digital Technologies, Inc., San Jose, CA (US)

(72) Inventors: Richard Leo Galbraith, Rochester, MN (US); Niranjay Ravindran, Rochester, MN (US); Roger William Wood, Gilroy, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 50 days.

(21) Appl. No.: 15/665,294

(22) Filed: Jul. 31, 2017

(65) Prior Publication Data
US 2018/0034484 A1 Feb. 1, 2018

Related U.S. Application Data

(60) Provisional application No. 62/368,959, filed on Jul. 29, 2016.

(51) Int. Cl.
| | |
|---|---|
| *H03M 13/41* | (2006.01) |
| *H03M 13/25* | (2006.01) |
| *G06F 17/22* | (2006.01) |
| *H03M 13/11* | (2006.01) |
| *H03M 13/37* | (2006.01) |
| *H03M 13/23* | (2006.01) |
| *H03M 13/45* | (2006.01) |

(52) U.S. Cl.
CPC .... *H03M 13/4138* (2013.01); *G06F 17/2264* (2013.01); *H03M 13/1111* (2013.01); *H03M 13/1171* (2013.01); *H03M 13/256* (2013.01); *H03M 13/3723* (2013.01); *H03M 13/1125* (2013.01); *H03M 13/1148* (2013.01); *H03M 13/23* (2013.01); *H03M 13/45* (2013.01)

(58) Field of Classification Search
CPC ..................................................... H03M 13/41
USPC ........................................ 714/795, 789, 792
See application file for complete search history.

(56) References Cited

U.S. PATENT DOCUMENTS

| | | | |
|---|---|---|---|
| 7,065,698 B2 * | 6/2006 | Oh | H03M 13/1515 714/756 |
| 8,255,763 B1 * | 8/2012 | Yang | H04L 1/0065 714/755 |
| 2008/0168320 A1 * | 7/2008 | Cassuto | G06F 11/1068 714/746 |
| 2010/0017676 A1 * | 1/2010 | Gross | H03M 13/1171 714/752 |
| 2018/0191375 A1 * | 7/2018 | Bear | H03M 13/1105 |

* cited by examiner

*Primary Examiner* — Fritz Alphonse
(74) *Attorney, Agent, or Firm* — Morgan, Lewis & Bockius LLP

(57) ABSTRACT

A method and data storage system receives a confidence vector for a non-binary symbol value read from a memory cell of a non-volatile memory device, where the confidence vector includes a first plurality of confidence values and transforms the first plurality of confidence values into a first plurality of likelihood values using a forward tensor-product transform. A respective binary message passing decoding operation is performed with each of the first plurality of likelihood values to generate a second plurality of likelihood values, and the second plurality of likelihood values are transformed into a second plurality of confidence values of the confidence vector using a reverse tensor-product transform.

24 Claims, 4 Drawing Sheets

NON-BINARY DECODING USING TENSOR PRODUCT TRANSFORMS

This application claims the benefit under 35 U.S.C. § 119(e) of U.S. Provisional Application No. 62/368,959 titled "EFFICIENT IMPLEMENTATION OF NON-BINARY LDPC USING TENSOR PRODUCT TRANSFORM" and filed on Jul. 29, 2016, which is hereby incorporated by reference herein.

BACKGROUND

Non-volatile memory continues to increase capacity by increasing the number of program states to which memory cells/locations can be programmed. For example, NAND flash memory is available as single-level cell (SLC) in which one bit is stored per memory cell, multi-level cell (MLC) in which two bits are stored per memory cell, triple-level cell (TLC) in which three bits are stored per memory cell. However, increasing the number of available program states may increase error rates and shorten the longevity of the data storage system. Decoding operations such as non-binary LDPC extends the longevity of the non-volatile memory, but at a high complexity cost.

SUMMARY

According to aspects of the subject disclosure, a method is described that includes receiving a confidence vector for a non-binary symbol value read from a memory cell of a non-volatile memory device, wherein the confidence vector comprises a first plurality of confidence values and transforming the first plurality of confidence values into a first plurality of likelihood values using a forward tensor-product transform. The method further includes performing a respective binary message passing decoding operation with each of the first plurality of likelihood values to generate a second plurality of likelihood values, and transforming the second plurality of likelihood values into a second plurality of confidence values of the confidence vector using a reverse tensor-product transform.

According to aspects of the subject disclosure, a processor-readable storage medium encoded with instructions that, when executed by a processor, perform a method is described. The method includes receiving a confidence vector for a non-binary symbol value read from a memory cell of a non-volatile memory device, wherein the confidence vector comprises a first plurality of confidence values, and transforming the first plurality of confidence values into a first plurality of likelihood values using a forward tensor-product transform. The method further includes performing a respective binary message passing decoding operation with each of the first plurality of likelihood values to generate a second plurality of likelihood values, wherein the respective binary message passing decoding operations are performed in parallel. The method further includes transforming the second plurality of likelihood values into a second plurality of confidence values of the confidence vector using a reverse tensor-product transform.

According to aspects of the subject disclosure, a data storage system is described that includes a non-volatile memory device and a controller. The controller is configured to receive a confidence vector for a non-binary symbol value read from a memory cell of the non-volatile memory device, where the confidence vector comprises a first plurality of confidence values, and transform the first plurality of confidence values into a first plurality of likelihood values using a forward tensor-product transform. The controller is further configured to perform a respective binary message passing decoding operation with each of the first plurality of likelihood values to generate a second plurality of likelihood values, wherein the respective binary message passing decoding operations are performed in parallel, and transform the second plurality of likelihood values into a second plurality of confidence values of the confidence vector using a reverse tensor-product transform. The first plurality of confidence values and the second plurality of confidence values each comprises q elements, and the first plurality of likelihood values and the second plurality of likelihood values each comprises q−1 elements.

According to aspects of the subject disclosure, a data storage system is described that includes a non-volatile memory device. The data storage system further includes means for transforming a first plurality of confidence values of a confidence vector for a non-binary symbol read from a memory cell of the non-volatile memory device into a first plurality of likelihood values using a forward tensor-product transform. The data storage system further includes means for performing a respective binary message passing decoding operation with each of the first plurality of likelihood values to generate a second plurality of likelihood values, wherein the respective binary message passing decoding operations are performed in parallel. The data storage system further includes means for transforming the second plurality of likelihood values into a second plurality of confidence values of the confidence vector using a reverse tensor-product transform.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical element numbers for ease of understanding.

Aspects of the present disclosure are directed in part to non-binary LDPC decoding operations in which the non-binary message passing decoding operation is replaced with multiple binary message passing decoding operations. The soft information used in decoding is transformed using tensor-product transforms. By incorporating a forward and a backward orthogonal tensor-product transform before and after the message passing process, a binary message passing algorithm can be used in between as the main computational engine for non-binary message passing. Advantageously, in some aspects of the subject technology, the transformation of a non-binary message passing process into multiple binary message passing processes enables the non-binary LDPC decoder for a non-volatile storage device to perform the decoding process with a lower power consumption, reduced memory requirement, and higher performance.

Figure 1:
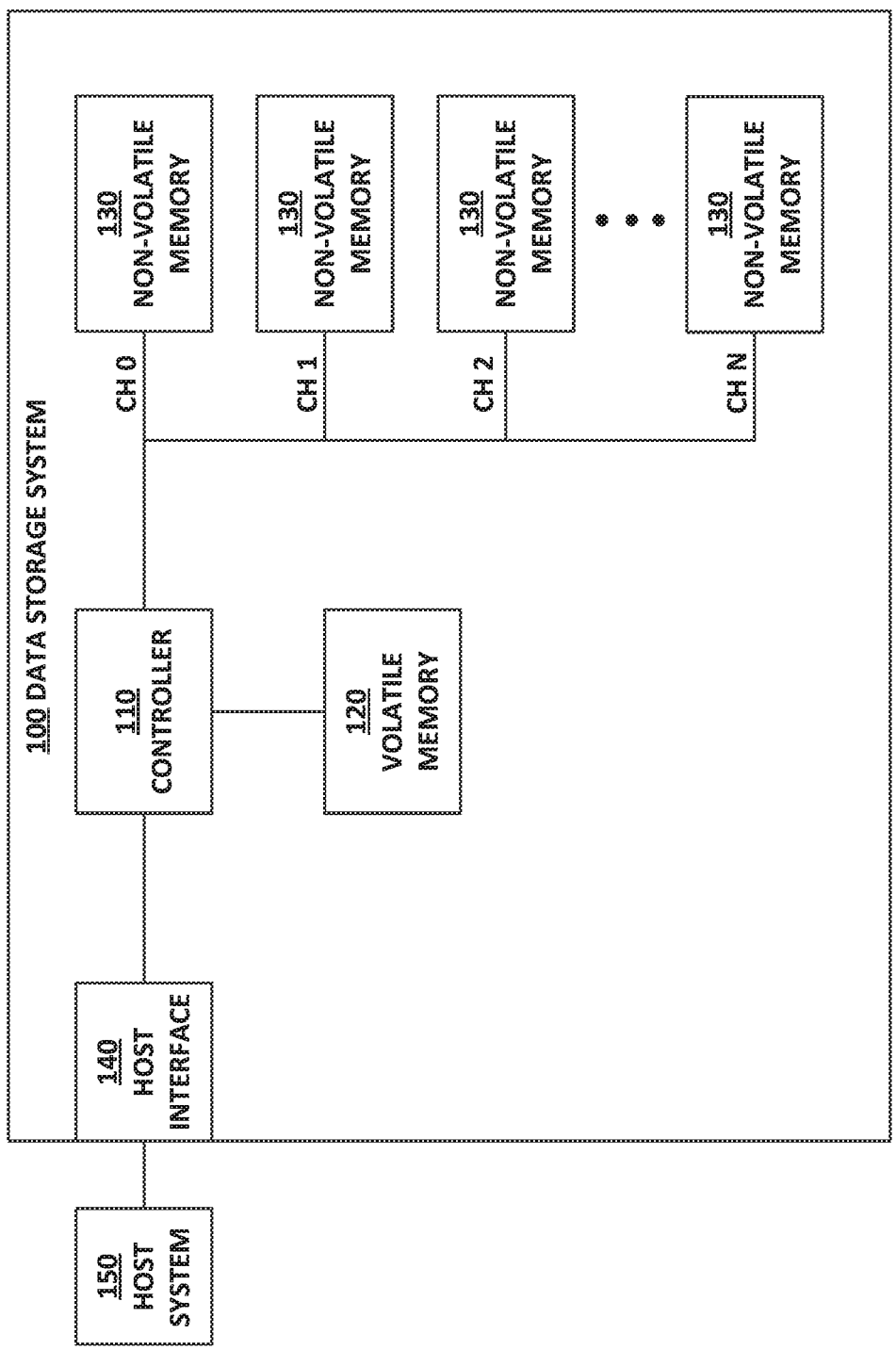
FIG. 1 is a block diagram illustrating components of a data storage system according to aspects of the subject technology.

FIG. 1 is a block diagram illustrating components of a data storage system 100 according to aspects of the subject technology. As depicted in FIG. 1, data storage system 100 includes controller 110, volatile memory 120, non-volatile memory devices 130, and host interface 140. Controller 110 is configured to process requests received from host system 150 via host interface 140 to access data in non-volatile memory devices 130. The data access requests received from host system 150 may include write requests to store host data in non-volatile memory 130, read requests to retrieve host data stored in non-volatile memory devices 130, and erase requests to erase host data stored in non-volatile memory devices 130. Other types of requests, such as status requests or device management requests, may be received from host system 150 and processed by controller 110.

Host interface 140 is configured to couple host system 150 to data storage system 100. Host interface 140 may include electrical and physical connections for operably coupling host system 150 to controller 110. Via the electrical and physical connections, host interface 140 is configured to communicate data, addresses, and control signals between host system 150 and controller 110. Controller 110 is configured to store host data received from host system 150 in non-volatile memory devices 130 in response to a write request received from host system 150, and to read host data stored in non-volatile memory devices 130 and to transfer the read host data to host system 150 via host interface 140 in response to a read request received from host system 150.

Host interface 140 may implement standard interfaces including, but not limited to, Serial Advanced Technology Attachment (SATA). Advanced Technology Attachment (ATA), Small Computer System Interface (SCSI), PCI-extended (PCI-X). Fibre Channel. Serial Attached SCSI (SAS), Secure Digital (SD). Embedded Multi-Media Card (EMMC). Universal Flash Storage (UFS) and Peripheral Component Interconnect Express (PCIe). However, the subject technology is not limited to the use of standard interfaces and may utilize custom or proprietary interfaces for communications with host system 150.

Host system 150 represents any device configured to be coupled to and communicate with data storage system 100 via host interface 140 to store and retrieve data in data storage system 100. Host system 150 may be a computing device such as a personal computer, a server, a workstation, a laptop computer, a smart phone, and the like. Alternatively, host system 150 may be an electronic device such as a digital camera, a digital audio player, a digital video recorder, and the like.

Controller 110 is configured to monitor and control the operation of components of data storage system 100 in response to requests received from host system 150 and during execution of internal maintenance operations. Controller 110 may include a multi-core processor, a general-purpose microprocessor, a microcontroller, a digital signal processor (DSP), an application specific integrated circuit (ASIC), a field programmable gate array (FPGA), a programmable logic device (PLD), a state machine, gated logic, discrete hardware components, or a combination of the foregoing. In some aspects, one or more components of controller 110 may be integrated into a single chip or module, or may be implemented in two or more discrete chips or modules.

Volatile memory 120 represents memory used by controller 110 to temporarily store data and information used to manage data storage system 100. For example, controller 110 may use volatile memory 120 as buffers for host data waiting to be written to non-volatile memory devices 130 or host data read from non-volatile memory devices 130 waiting to be transferred to host system 150 or written back to non-volatile memory devices 130. Controller 110 may store various types of system data used in the management of data storage system 100 in volatile memory 120. The system data may include data for tracking the types of encoding used when storing data in different devices in non-volatile memory devices 130. The system data also may include tables mapping logical addresses referenced by host system 150 to physical addresses of non-volatile memory devices 130, program/erase (P/E) cycle counts, error statistics, valid/invalid data counts, etc. Controller 110 may store some or all of the data and information described above in non-volatile memory devices 130, or another form of non-volatile memory not shown, so as to preserve the data and information when data storage system 100 is shut down or otherwise loses power. Controller 110 may periodically store copies of the data and information in non-volatile memory devices 130 or may wait for a shutdown or power-loss event to back up the data and information in non-volatile memory devices 130.

Volatile memory 120 may be a random-access memory (RAM) such as static RAM (SRAM) or dynamic RAM (DRAM). However, the subject technology is not limited to any particular type of RAM. In addition, volatile memory 120 may be implemented using a single RAM module or multiple RAM modules. While volatile memory 120 is depicted as being distinct from controller 110, portions or all of volatile memory 120 may be incorporated into controller 110.

As depicted in FIG. 1, multiple non-volatile memory devices 130 are arranged in multiple channels. For example, FIG. 1 illustrates each of N channels having one non-volatile memory device 130. Each of the non-volatile memory devices 130 may include a single die or multiple die. Each die includes non-volatile memory cells, such as NAND flash memory cells or 3D NAND flash memory cells. Each of the non-volatile memory devices 130 may be implemented in respective chips or packages. While each channel is depicted as having a single non-volatile memory device 130, the subject technology may include implementations in which each channel includes two or more non-volatile memory devices 130.

The flash memory cells of a die may be arranged in physical blocks, with each block containing multiple worldlines. Each wordline includes a number of non-volatile memory cells (e.g., 1 kB, 2 kB, 4 kB, 16 kB, etc.). The subject technology is not limited to any particular number of wordlines in each physical block. For example, each block may contain 8 wordlines, 16 wordlines, 32 wordlines, etc. Furthermore, the number of physical blocks contained in each flash memory die is not limited to any particular number. In NAND flash memory, the page of a wordline, or the wordline as a whole, represents the smallest unit available for writing data to the flash memory die or reading data from the flash memory die. Physical blocks represent the smallest unit available for erasing data in the flash memory die.

Controller 110 is configured to communicate commands, control information, addresses, data, etc. with the flash memory die via the respective flash memory channels 0-N. Each channel may represent one or more buses configured to communicate electrical signals encoded with commands, control information, addresses, and/or data between controller 110 and the flash memory die coupled to the respective flash memory channel. The subject technology is not limited to any particular number of flash memory channels. For example, data storage system 100 may include 8 channels, 16 channels, 32 channels, etc.

The foregoing examples focus on flash memory as the non-volatile memory to which data is written to and read from. However, the subject technology is not limited to flash memory and may be practiced for magnetic media, and other forms of electronic media besides flash memory.

Figure 2:
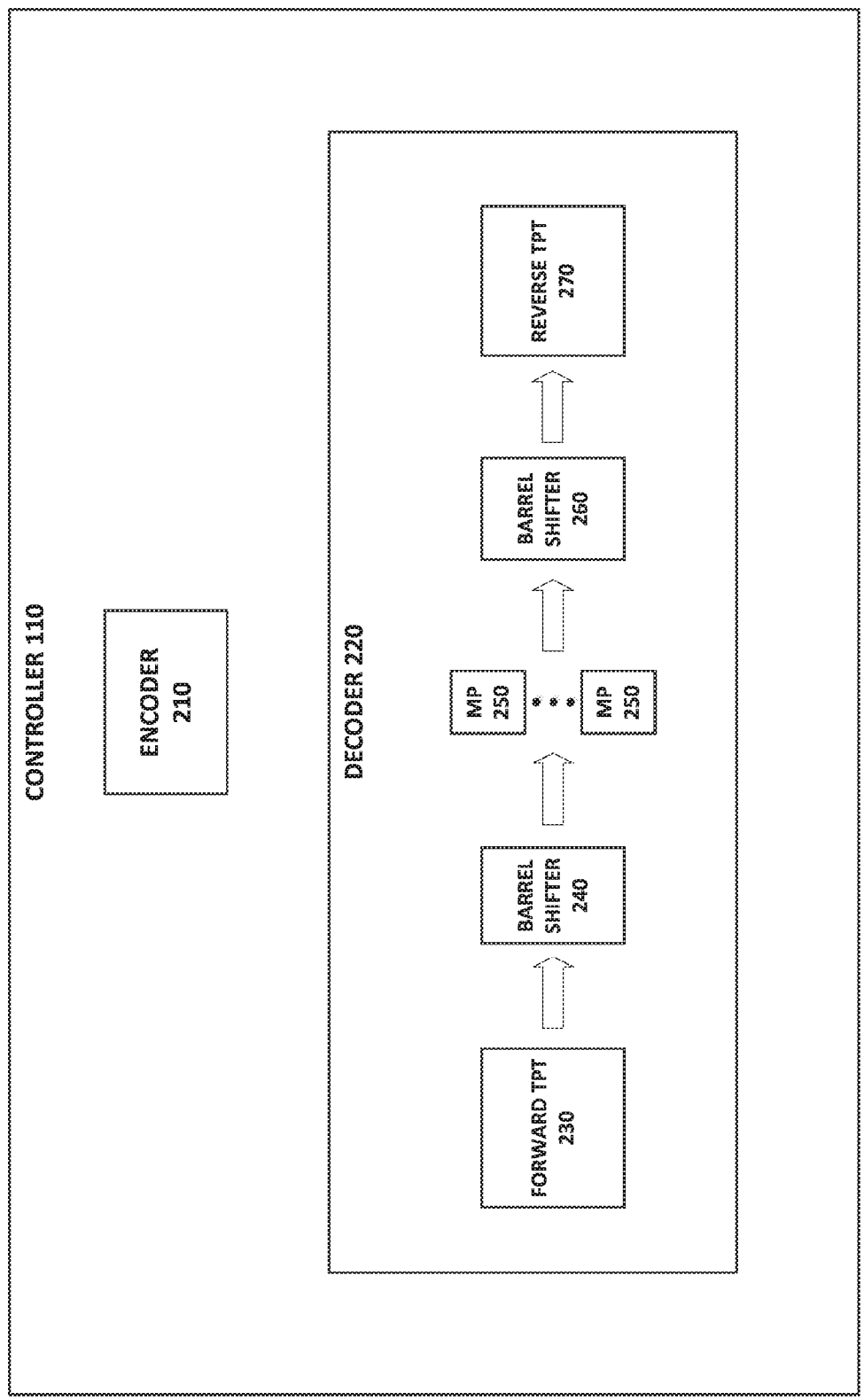
FIG. 2 is a block diagram illustrating components of a controller according to aspects of the subject technology.

FIG. 2 is a block diagram illustrating components of controller 110 according to aspects of the subject technology. As depicted in FIG. 2, controller 110 may include encoder 210 and decoder 220. Controller 110 is not limited to these particular components and may include other types of components. In addition, controller 110 is not limited to single instances of any given component and may be implemented with multiple instances of any of the components.

Encoder 210 is configured to encode data to generate a codeword for storage in non-volatile memory 130. According to aspects of the subject technology, encoder 210 uses a non-binary error-correcting code (ECC) algorithm such as a non-binary low-density parity-check (LDPC) code algorithm to generate the codeword. Decoder 220 is configured to decode a codeword read from non-volatile memory 130 to retrieve the encoded data using the decoding portion of the ECC algorithm used to encode the data. Controller 110 may include multiple instances of encoder 210 and/or decoder 220 to increase available bandwidth for processing data being stored in non-volatile memory 130 and data being read from non-volatile memory 130.

Decoder 220 may include forward tensor-product transform module 230, barrel shifter 240, binary message passing modules 250, barrel shifter 260, and reverse tensor-product transform module 270. Briefly, forward tensor-product transform module 230 is configured to transform the first confidence values of a confidence vector for a non-binary symbol read from non-volatile memory into first likelihood values. The first likelihood values may be shifted by barrel shifter 240 prior to being provided to binary message passing modules 250 for binary message passing decoding operations to generate second likelihood values. The second likelihood values may be shifted back by barrel shifter 260 prior to being provided to reverse tensor-product transform module 270 for transformation to second confidence values of the confidence vector. These operations are described in more detail below.

In addition to the components depicted in FIG. 2, controller 110 may include other components. For example, controller 110 may include managers and schedulers for managing read, write, and erase operations within data storage system 100. Controller 110 also may include an address translation manager to manage the translation of host addresses used by host system 150 to physical addresses of the blocks, wordlines and pages within non-volatile memory 130. Other components may include scramblers, descramblers, maintenance managers (e.g., garbage collection, wear leveling, data relocation, etc.).

The components of controller 110 each may be implemented using one or more sequences of instructions (e.g., software/firmware) loaded and executed by a processor or processor core, using hardware logic circuits, or a combination of hardware and software/firmware. For example, in a controller that includes multiple processors or a multi-core processor, individual processors or processor cores may be assigned to provide the functionality of respective components of controller 110. Furthermore, one or more of the components discussed above may be implemented outside of controller 110 without departing from the scope of the subject technology.

Figure 3:
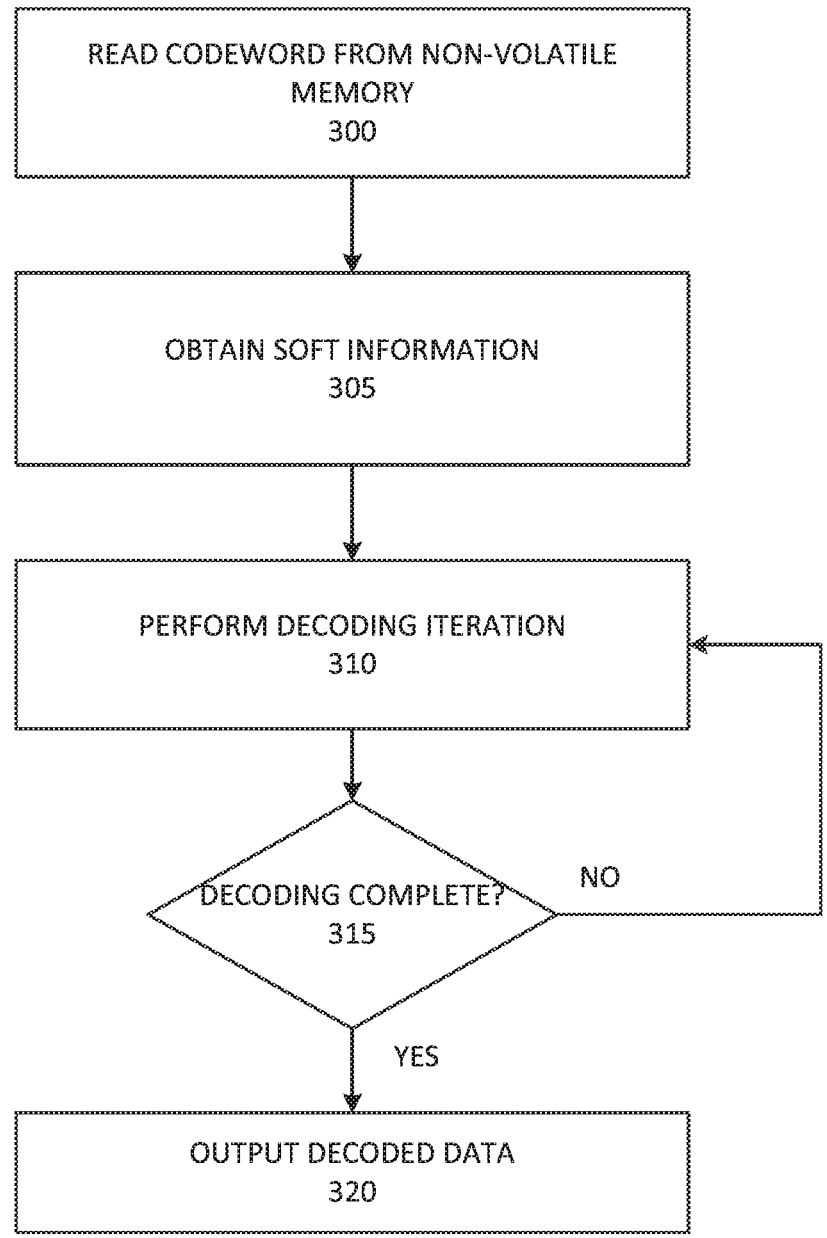
FIG. 3 is a flowchart of a process for decoding a codeword read from non-volatile memory according to aspects of the subject technology.

FIG. 3 is a flowchart of a process for decoding a codeword read from non-volatile memory according to aspects of the subject technology. The process begins upon controller 110 reading a codeword from non-volatile memory 130 (block 300). The codeword includes symbol values read from respective memory cells/locations in the non-volatile memory. In addition to the codeword, controller 110 may obtain soft information used in the decoding process to decode the codeword (block 305). The soft information may include confidence values corresponding the read symbol values to provide an indication of whether the symbol values read from the memory cells are correct. The soft information may be in the form of confidence values reflecting a difference between the symbol value read and an expected symbol value. The soft information also may be in the form of a log-likelihood ratio (LLR) reflecting a ratio of probabilities of the symbol value being one or two different values.

In binary LDPC applications, a binary LLR may include the logarithm of a ratio between the probability of a bit being '0' or '1'. A positive LLR may indicate that a value read from the memory cell may likely be a 0-bit, and a negative LLR may indicate that the value read from the memory cell may likely be a 1-bit. Each bit of a codeword may be assigned an LLR. In some examples, a bit value having an assigned LLR equal to five may be more likely to be a first predetermined value (e.g., a binary '0') than a bit value having an assigned LLR equal to a second predetermined value (e.g., a binary '1'). A bit value having an assigned LLR equal to zero may be equally likely to be either predetermined value.

In non-binary LDPC applications, a codeword may comprise multiple symbols in which each symbol represents more than one bit of data. For example, MLC flash memory each memory cell may be programmed into one of four states so that each symbol stored represents a value in the set $\{0, 1, 2, 3\}$, which further represents two bits of a codeword (binary 00, 01, 10, 11). The soft information in non-binary LDPC applications may be represented in a confidence vector in which the number of vector elements may be equal to the number of possible symbol values. For example, if the symbol has four possible values $\{0, 1, 2, 3\}$ then the confidence vector may have four vector components, $V=<v_1, v_2, v_3, v_4>$.

The soft information for the codeword may be used in an iterative decoding operation (block 310). During each iteration, the LDPC decoding process includes a process of updating the confidence vectors for each of the symbols in the codeword using a message passing operation. During the message passing operation, the confidence vectors are passed between variable nodes and check nodes according to parity check equations defined by a parity check matrix. During the message passing operation, the confidence values of the confidence vectors may be updated using a min-sum algorithm, for example.

For example, a variable node associated with the 2000th symbol of the codeword ($vn_{i=2000}$) may initially hold a confidence vector V=<1, 3, 8, 2>. The decoder may calibrate V by selecting an index of the component vector, reducing the component at that index to zero, while reducing other components within the confidence vector by a similar amount. For example, V=<1, 3, 8, 2> is calibrated to become V'=<0, 2, 7, 1>. In other aspects, the decoder may calibrate V by a normalization process (e.g., based on 1) such that V=<0.1, 0.3, 0.8, 0.2>.

The component of the confidence vector having the highest value may be selected as the primary component of the confidence vector, such that the index of the primary component is representative of the symbol value. For example, where V=<0, 2, 7, 1>, the third index (with the highest value of "7") determines the state of the memory cell, in this example, equivalent to a binary "10" (e.g., $i_2$ of {00, 01, 10, 11}). With each iteration, if the symbol is correct then the value of the third index ($i_2$) will converge to infinity, while the values of the other indices of the confidence vector converge to zero or negative infinity (e.g., the log of zero). If the index of the primary component changes, and converges to negative infinity then the symbol is incorrect. In that case, the codeword will contain at a location corresponding to the variable node a new symbol associated with the new index of the primary component. For example, if V'=<0, 7, 2, 1> then the symbol is determined to be in the second state, indicating a binary "01". It is understood that during the decoding process a symbol need not be associated with a binary value with each iteration, but, rather, symbols may be converted to binary values at the completion of the decoding process (e.g., after all component values for all variable nodes have converged).

If the confidence values of the confidence vectors have not converged after an iteration of the decoding process (block 315), another decoding iteration is performed (block 310). This iterative process continues until the confidence values of the confidence vectors have converged or a predetermined number of decoding iterations have been performed. If the confidence values of the confidence vectors have converged, the decoded data is output (block 320). If no convergence has occurred after a predetermined number of iterations, a read error may be generated.

Figure 4:
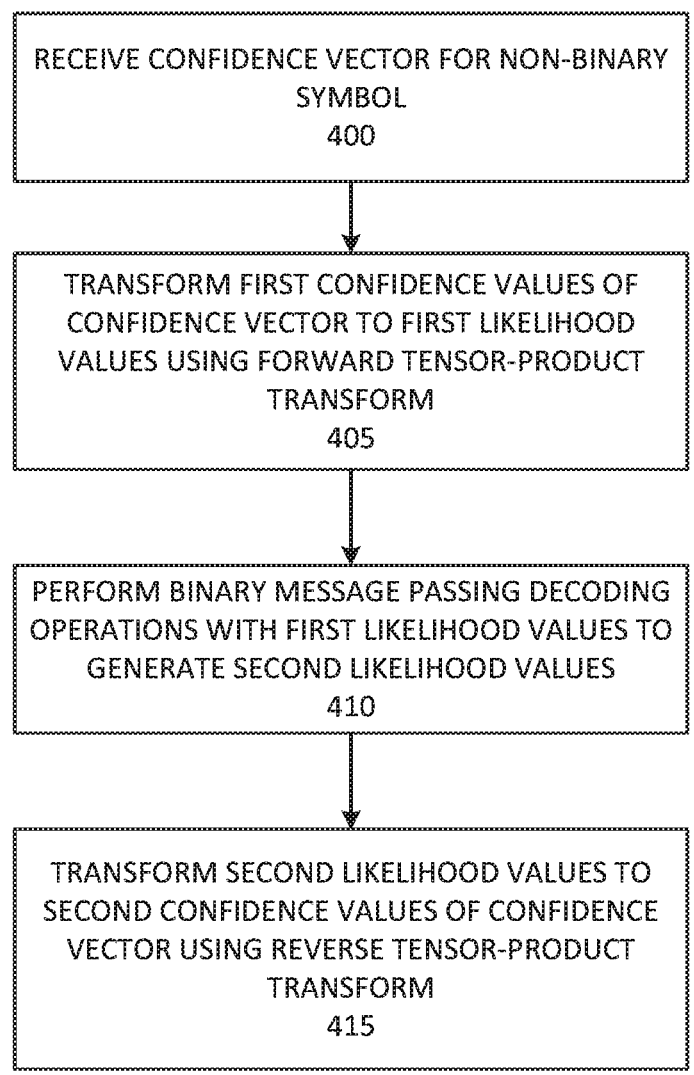
FIG. 4 is a flowchart of a process for an iteration of a decoding operation according to aspects of the subject technology.

FIG. 4 is a flowchart of a process for an iteration of a decoding operation according to aspects of the subject technology. The process illustrated in FIG. 4 corresponds with block 310 in FIG. 3. According to aspects of the subject technology, each iteration of the decoding operation processes a codeword with respect to one row of the LDPC parity check matrix. In this regard, only the symbols corresponding to non-zero elements in the row of the parity check matrix are processed during the iteration. The process illustrated in FIG. 4 will be described with respect to a single symbol value of a codeword read from non-volatile memory. The process is the same for each of the symbol values corresponding to the non-zero elements in the parity check matrix.

A confidence vector for a non-binary symbol value read from a memory cell/location in non-volatile memory is received at the beginning of each message passing iteration (block 400). For a symbol size of p bits, the confidence vector may have q confidence values, where $q=2^p$. The confidence values of the confidence vector are transformed into likelihood values using a forward tensor-product transform (block 405). According to aspects of the subject technology, the forward tensor-product transform decomposes the confidence vector having q confidence values, which would have been processed in a non-binary message passing decoding operation, into q-1 likelihood values for which respective q-1 binary message passing decoding operations are performed to generate new likelihood values using min-sum algorithms, for example (block 410). The q-1 binary message passing decoding operations can be performed in parallel to increase the performance of the decoder. For example, for a given iteration of the decoding operation, the likelihood values associated with the symbols being processed and corresponding to the same row of a tensor-product transform matrix T are part of a respective layer of binary message passing decoding operations. According to the example above, q-1 layers of binary message passing decoding operations are performed in parallel in place of the single non-binary message passing decoding operation using the confidence vector.

After the binary message passing decoding operation for the iteration has completed, the new likelihood values are transformed to new confidence values for the confidence vector using a reverse tensor-product transform (block 415). The reverse tensor-product transform may include applying a scale factor $p/(2^p-1)$ to the generated second non-binary values. The decoding results are output as the confidence vector for the next iteration, or as the final results if the last iteration has been reached.

In an LDPC parity check matrix, the non-zero elements are set to one of q-1 non-zero finite field elements used for encoding. During the decoding operation for a codeword, the confidence vectors for the symbol values corresponding to the non-zero elements in the LDPC parity check matrix are multiplied by the symbol value of the corresponding non-zero element. According to aspects of the subject technology, following the forward tensor-product transform of the confidence values, this multiplication can be accomplished by a barrel shift of the likelihood values resulting from the transform by an amount equal to element number of the finite field element set at the corresponding matrix location. For example, if the second element of the finite field elements is set at the matrix location, the likelihood values are barrel shifted two values. Similarly, following the binary message passing decoding operations and prior to the reverse tensor-product transform, the generated likelihood values are barrel shifted back by the same number of values.

To illustrate the example process, consider a LDPC code over a Galois field GF(q). An equivalent binary Tanner graph called binary image of the code can be constructed for GF(q) to reduce the complexity of non-binary decoding. There are many ways to construct binary images of non-binary codes, for example, a basic binary image is to represent each non-binary symbol by a binary vector of the same bit length. By extending this basic binary image, a mapping can be determined between each non-binary symbol of GF(q) and a set of ($2^p-1$) binary images.

Assuming a symbol size of the non-binary LDPC code is three, i.e., p=3 and q=8. The binary field can be extended for the Galois field GF(8) using a primitive polynomial $x^3+x^2=1$. The extended finite field for the seven non-zero elements is represented in equation (1) below and is a tensor parity construct $P^0$ constructed for symbol $\alpha^0$:

$$P^0 = \begin{pmatrix} a^0 \\ a^1 \\ a^2 \\ a^3 \\ a^4 \\ a^5 \\ a^6 \end{pmatrix} = \begin{pmatrix} 0 & 0 & 1 \\ 0 & 1 & 0 \\ 1 & 0 & 1 \\ 0 & 1 & 1 \\ 1 & 1 & 1 \\ 1 & 1 & 0 \\ 1 & 0 & 0 \end{pmatrix} \quad (1)$$

To obtain tensor parity constructs for the other non-zero elements of the finite field, a barrel shift can be performed to rotate the binary images by a value corresponding to the element value. For example, a tensor parity construct for symbol $\alpha^1$ can be determined by shifting the top row (0 0 1) to the bottom of the tensor parity construct. Each row of the tensor parity construct is used for a binary parity check equation when processing the likelihood values in the binary message passing decoding operations.

The tensor-product transform matrix T may be defined as $P^0 \otimes E$, where $\otimes$ represents matrix multiplication in GF(2) with element XOR operations. The columns of E contain the binary values for all of the elements of the finite field in numerical order.

$$E = \begin{pmatrix} 0 & 1 & 0 & 1 & 0 & 1 & 0 & 1 \\ 0 & 0 & 1 & 1 & 0 & 0 & 1 & 1 \\ 0 & 0 & 0 & 0 & 1 & 1 & 1 & 1 \end{pmatrix} \quad (2)$$

Thus, the tensor-product transform matrix T can be written as:

$$T = P^0 \otimes E = \begin{pmatrix} 0 & 0 & 1 \\ 0 & 1 & 0 \\ 1 & 0 & 1 \\ 0 & 1 & 1 \\ 1 & 1 & 1 \\ 1 & 1 & 0 \\ 1 & 0 & 0 \end{pmatrix} \otimes \begin{pmatrix} 0 & 1 & 0 & 1 & 0 & 1 & 0 & 1 \\ 0 & 0 & 1 & 1 & 0 & 0 & 1 & 1 \\ 0 & 0 & 0 & 0 & 1 & 1 & 1 & 1 \end{pmatrix} = \quad (3)$$

$$\begin{pmatrix} 0 & 0 & 0 & 0 & 1 & 1 & 1 & 1 \\ 0 & 0 & 1 & 1 & 0 & 0 & 1 & 1 \\ 0 & 1 & 0 & 1 & 1 & 0 & 1 & 0 \\ 0 & 0 & 1 & 1 & 1 & 1 & 0 & 0 \\ 0 & 1 & 1 & 0 & 1 & 0 & 0 & 1 \\ 0 & 1 & 1 & 0 & 0 & 1 & 1 & 0 \\ 0 & 1 & 0 & 1 & 0 & 1 & 0 & 1 \end{pmatrix}$$

The forward tensor-product transform processes the confidence values of the received confidence vector with respect to each row of the matrix T using a non-linear transform to produce a likelihood value corresponding to each row. Consider an example input confidence vector for symbol $\alpha^0 \cdot V = <v_1, v_2, v_3, v_4, v_5, v_6, v_7, v_8>$. The confidence values are aligned with the columns of T. The forward tensor-product transform determines the likelihood value corresponding to a given row of T by determining the difference of the lowest value in a first subset of the confidence values corresponding to matrix elements having a "1" value and the lowest value in a second subset of the confidence values corresponding to matrix elements having a "0" value. For example, the likelihood value transformed using the first row is determined by the following:

$$w_1 = \min(v_5, v_6, v_7, v_8) - \min(v_1, v_2, v_3, v_4).$$

Similarly, $w_2 = \min(v_3, v_4, v_7, v_8) - \min(v_1, v_2, v_5, v_6)$, and $w_7 = \min(v_2, v_4, v_6, v_8) - \min(v_1, v_3, v_5, v_7)$.

The reverse tensor-product transform processes the likelihood values generated by the binary message passing decoding operations with respect to each column of matrix T using a linear transform to produce an updated confidence value of the confidence matrix corresponding to each column. According to aspects of the subject technology, a linear addition operation is performed for each column, with likelihood values corresponding to "0" entries in matrix T being added and likelihood values corresponding to "1" entries in matrix T being subtracted. The subject technology is not limited to the min-sum operation described above for the forward tensor-product transform or the linear addition process for the reverse tensor-product transform.

The subject technology transforms a non-binary LDPC decoding process into multiple binary LDPC decoding processes. This reduces the complexity from $3q^2$ to $q^2$. Furthermore, this reduction in complexity is reflected in hardware configurations having lower power consumption, reduced memory requirements, and higher performance of the overall data storage system.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of example approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all aspects, or one or more aspects. An embodiment may provide one or more examples. A phrase such as an "embodiment" may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method, comprising:
   receiving a confidence vector for a non-binary symbol value read from a memory cell of a non-volatile memory device, wherein the confidence vector comprises a first plurality of confidence values;
   transforming the first plurality of confidence values into a first plurality of likelihood values using a forward tensor-product transform;
   performing a respective binary message passing decoding operation with each of the first plurality of likelihood values to generate a second plurality of likelihood values;
   transforming the second plurality of likelihood values into a second plurality of confidence values of the confidence vector using a reverse tensor-product transform; and
   determining a state of the memory cell based on the second plurality of confidence values.

2. The method of claim 1, wherein the first plurality of confidence values and the second plurality of confidence values each comprises q elements, and
   wherein the first plurality of likelihood values and the second plurality of likelihood values each comprises q−1 elements.

3. The method of claim 2, wherein the forward tensor-product transform comprises determining a difference between a lowest value of a first subset of the first plurality of confidence values and a lowest value of a second subset of the first plurality of confidence values, wherein the difference is set as one value of the first plurality of likelihood values.

4. The method of claim 3, wherein the first and second subsets of the first plurality of confidence values are different for each value of the first plurality of likelihood values, and
   wherein the first and second subsets of the first plurality of confidence values are selected based on respective rows of a tensor parity matrix.

5. The method of claim 2, wherein the reverse tensor-product transform comprises determining a difference between a sum of a first subset of the second plurality of likelihood values and a sum of a second subset of the second plurality of likelihood values, wherein the difference is set as one value of the second plurality of confidence values.

6. The method of claim 5, wherein the first and second subsets of the second plurality of likelihood values are different for each value of the second plurality of confidence values, and
   wherein the first and second subsets of the second plurality of likelihood values are selected based on respective rows of a tensor parity matrix.

7. The method of claim 1, further comprising:
   barrel shifting the first plurality of likelihood values in a first direction based on a field element at a location of a parity check matrix corresponding to the non-binary symbol value before performing the respective binary message passing decoding operations; and
   barrel shifting the second plurality of likelihood values in a second direction opposite the first direction based on the field element after performing the respective binary message passing decoding operations.

8. The method of claim 1, further comprising multiplying the second plurality of likelihood values by a scaling factor prior to the reverse tensor product transform.

9. The method of claim 1, wherein the respective binary message passing decoding operations are performed in parallel.

10. A processor-readable storage medium encoded with instructions that, when executed by a processor, perform a method comprising:

receiving a confidence vector for a non-binary symbol value read from a memory cell of a non-volatile memory device, wherein the confidence vector comprises a first plurality of confidence values;

transforming the first plurality of confidence values into a first plurality of likelihood values using a forward tensor-product transform;

performing a respective binary message passing decoding operation with each of the first plurality of likelihood values to generate a second plurality of likelihood values, wherein the respective binary message passing decoding operations are performed in parallel;

transforming the second plurality of likelihood values into a second plurality of confidence values of the confidence vector using a reverse tensor-product transform; and determining a state of the memory cell based on the second plurality of confidence values.

11. The processor-readable storage medium of claim 10, wherein the first plurality of confidence values and the second plurality of confidence values each comprises q elements, and
wherein the first plurality of likelihood values and the second plurality of likelihood values each comprises q−1 elements.

12. The processor-readable storage medium of claim 11, wherein the forward tensor-product transform comprises determining a difference between a lowest value of a first subset of the first plurality of confidence values and a lowest value of a second subset of the first plurality of confidence values, wherein the difference is set as one value of the first plurality of likelihood values.

13. The processor-readable storage medium of claim 12, wherein the first and second subsets of the first plurality of confidence values are different for each value of the first plurality of likelihood values, and
wherein the first and second subsets of the first plurality of confidence values are selected based on respective rows of a tensor parity matrix.

14. The processor-readable storage medium of claim 11, wherein the reverse tensor-product transform comprises determining a difference between a sum of a first subset of the second plurality of likelihood values and a sum of a second subset of the second plurality of likelihood values, wherein the difference is set as one value of the second plurality of confidence values.

15. The processor-readable storage medium of claim 14, wherein the first and second subsets of the second plurality of likelihood values are different for each value of the second plurality of confidence values, and
wherein the first and second subsets of the second plurality of likelihood values are selected based on respective rows of a tensor parity matrix.

16. The processor-readable storage medium of claim 10, wherein the method further comprises:
barrel shifting the first plurality of likelihood values in a first direction based on a field element at a location of a parity check matrix corresponding to the non-binary symbol value before performing the respective binary message passing decoding operations; and
barrel shifting the second plurality of likelihood values in a second direction opposite the first direction based on the field element after performing the respective binary message passing decoding operations.

17. A data storage system, comprising:
a non-volatile memory device; and
a controller configured to:

receive a confidence vector for a non-binary symbol value read from a memory cell of the non-volatile memory device, wherein the confidence vector comprises a first plurality of confidence values;

transform the first plurality of confidence values into a first plurality of likelihood values using a forward tensor-product transform;

perform a respective binary message passing decoding operation with each of the first plurality of likelihood values to generate a second plurality of likelihood values, wherein the respective binary message passing decoding operations are performed in parallel;

transform the second plurality of likelihood values into a second plurality of confidence values of the confidence vector using a reverse tensor-product transform,
wherein the first plurality of confidence values and the second plurality of confidence values each comprises q elements, and
wherein the first plurality of likelihood values and the second plurality of likelihood values each comprises q−1 elements; and determine a state of the memory cell based on the second plurality of confidence values.

18. The data storage system of claim 17, wherein the forward tensor-product transform comprises determining a difference between a lowest value of a first subset of the first plurality of confidence values and a lowest value of a second subset of the first plurality of confidence values, wherein the difference is set as one value of the first plurality of likelihood values.

19. The data storage system of claim 18, wherein the first and second subsets of the first plurality of confidence values are different for each value of the first plurality of likelihood values, and
wherein the first and second subsets of the first plurality of confidence values are selected based on respective rows of a tensor parity matrix.

20. The data storage system of claim 17, wherein the reverse tensor-product transform comprises determining a difference between a sum of a first subset of the second plurality of likelihood values and a sum of a second subset of the second plurality of likelihood values, wherein the difference is set as one value of the second plurality of confidence values.

21. The data storage system of claim 20, wherein the first and second subsets of the second plurality of likelihood values are different for each value of the second plurality of confidence values, and
wherein the first and second subsets of the second plurality of likelihood values are selected based on respective rows of a tensor parity matrix.

22. The data storage system of claim 17, wherein the controller is further configured to:
barrel shift the first plurality of likelihood values in a first direction based on a field element at a location of a parity check matrix corresponding to the non-binary symbol value before performing the respective binary message passing decoding operations; and
barrel shift the second plurality of likelihood values in a second direction opposite the first direction based on the field element after performing the respective binary message passing decoding operations.

23. A data storage system, comprising:
a non-volatile memory device;
means for transforming a first plurality of confidence values of a confidence vector for a non-binary symbol read from a memory cell of the non-volatile memory device into a first plurality of likelihood values using a forward tensor-product transform;

means for performing a respective binary message passing decoding operation with each of the first plurality of likelihood values to generate a second plurality of likelihood values, wherein the respective binary message passing decoding operations are performed in parallel;

means for transforming the second plurality of likelihood values into a second plurality of confidence values of the confidence vector using a reverse tensor-product transform; and means for determining a state of the memory cell based on the second plurality of confidence values.

24. The data storage system of claim 23, further comprising:

means for barrel shifting the first plurality of likelihood values in a first direction based on a field element at a location of a parity check matrix corresponding to the non-binary symbol value before performing the respective binary message passing decoding operations; and means for barrel shifting the second plurality of likelihood values in a second direction opposite the first direction based on the field element after performing the respective binary message passing decoding operations.

* * * * *